United States Patent
Yoo et al.

(10) Patent No.: US 12,153,098 B2
(45) Date of Patent: Nov. 26, 2024

(54) DEVICE FOR INSPECTING FOR ELECTRODE ASSEMBLY DEFECTS BEFORE ELECTROLYTE INJECTION AND DEFECT INSPECTION METHOD THEREFOR

(71) Applicant: LG ENERGY SOLUTION, LTD., Seoul (KR)

(72) Inventors: Jae Woong Yoo, Daejeon (KR); Sun Yong Shin, Daejeon (KR); Jeong Min Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 143 days.

(21) Appl. No.: 17/919,372

(22) PCT Filed: Feb. 7, 2022

(86) PCT No.: PCT/KR2022/001818
§ 371 (c)(1),
(2) Date: Oct. 17, 2022

(87) PCT Pub. No.: WO2022/173173
PCT Pub. Date: Aug. 18, 2022

(65) Prior Publication Data
US 2023/0160975 A1 May 25, 2023

(30) Foreign Application Priority Data
Feb. 9, 2021 (KR) .......................... 10-2021-0018508

(51) Int. Cl.
*G01R 31/52* (2020.01)
*G01R 19/165* (2006.01)
(Continued)

(52) U.S. Cl.
CPC ....... *G01R 31/52* (2020.01); *G01R 19/16576* (2013.01); *G01R 19/25* (2013.01); *H01M 10/4285* (2013.01)

(58) Field of Classification Search
CPC ... G01R 31/52; G01R 19/16576; G01R 19/25
See application file for complete search history.

(56) References Cited

U.S. PATENT DOCUMENTS 7,560,901 B2 * 7/2009 Fujikawa .............. H02J 7/0036
320/134
10,895,606 B1 * 1/2021 Patrissi ................ G01R 31/386
(Continued)

FOREIGN PATENT DOCUMENTS

JP 2000-195565 A 7/2000
JP 2004-111371 A 4/2004
(Continued)

OTHER PUBLICATIONS

International Search Report (PCT/ISA/210) issued in PCT/KR2022/001818 mailed on Jul. 6, 2022.
(Continued)

*Primary Examiner* — Reena Aurora
(74) *Attorney, Agent, or Firm* — Birch, Stewart, Kolasch & Birch, LLP

(57) ABSTRACT

An apparatus for inspecting a failure of an electrode assembly before injecting an electrolyte includes a short-circuit tester configured to detect a short circuit of the electrode assembly by applying a predetermined voltage to a positive electrode and a negative electrode of the electrode assembly; a multimeter electrically connected to the short-circuit tester and configured to measure a voltage and a current of the electrode assembly over time; and a failure determination
(Continued)

part connected to the multimeter and configured to monitor changes in voltage and current measured by the multimeter and determine a type of a failure of the electrode assembly from data on the changes in voltage and current over a predetermined period of time. A method of inspecting a failure of an electrode assembly using the same is also provided.

12 Claims, 7 Drawing Sheets

(51) Int. Cl.
*G01R 19/25* (2006.01)
*H01M 10/42* (2006.01)

(56) References Cited

U.S. PATENT DOCUMENTS

| | | |
|---|---|---|
| 2001/0028238 A1 | 10/2001 | Nakamura et al. |
| 2005/0242820 A1 | 11/2005 | Kume et al. |
| 2006/0061365 A1 | 3/2006 | Lee |
| 2018/0011144 A1 | 1/2018 | Hashimoto |
| 2019/0324089 A1 | 10/2019 | Kang et al. |
| 2023/0122362 A1* | 4/2023 | Shoa Hassani Lashidani ............ G01R 31/392 702/63 |

FOREIGN PATENT DOCUMENTS

| | | |
|---|---|---|
| JP | 2006-94523 A | 4/2006 |
| JP | 4313625 B2 | 8/2009 |
| JP | 2010-216995 A | 9/2010 |
| KR | 10-2001-0082115 A | 8/2001 |
| KR | 10-2005-0057001 A | 6/2005 |
| KR | 10-2013-0081249 A | 7/2013 |
| KR | 10-2017-0053529 A | 5/2017 |
| KR | 10-1775213 B1 | 9/2017 |
| KR | 10-2018-0001351 A | 1/2018 |
| KR | 10-2161028 B1 | 10/2020 |

OTHER PUBLICATIONS

European Search Report for European Application No. 22752933.6, dated Nov. 23, 2023.

* cited by examiner

[FIG. 1] CONVENTIONAL ART
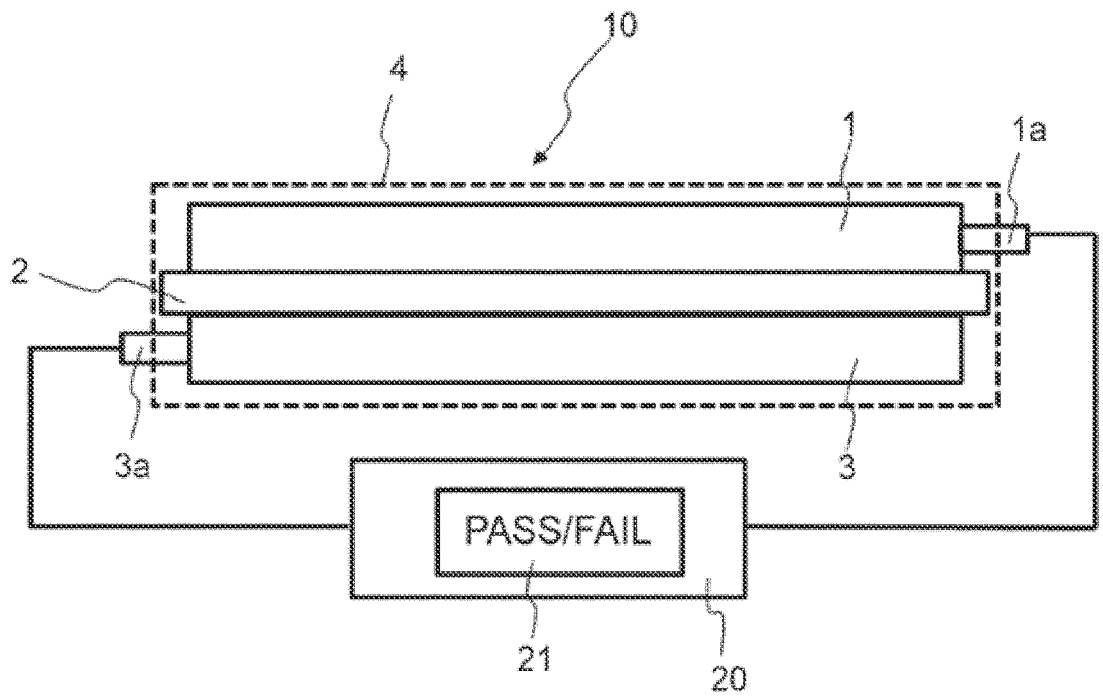

[FIG. 2]
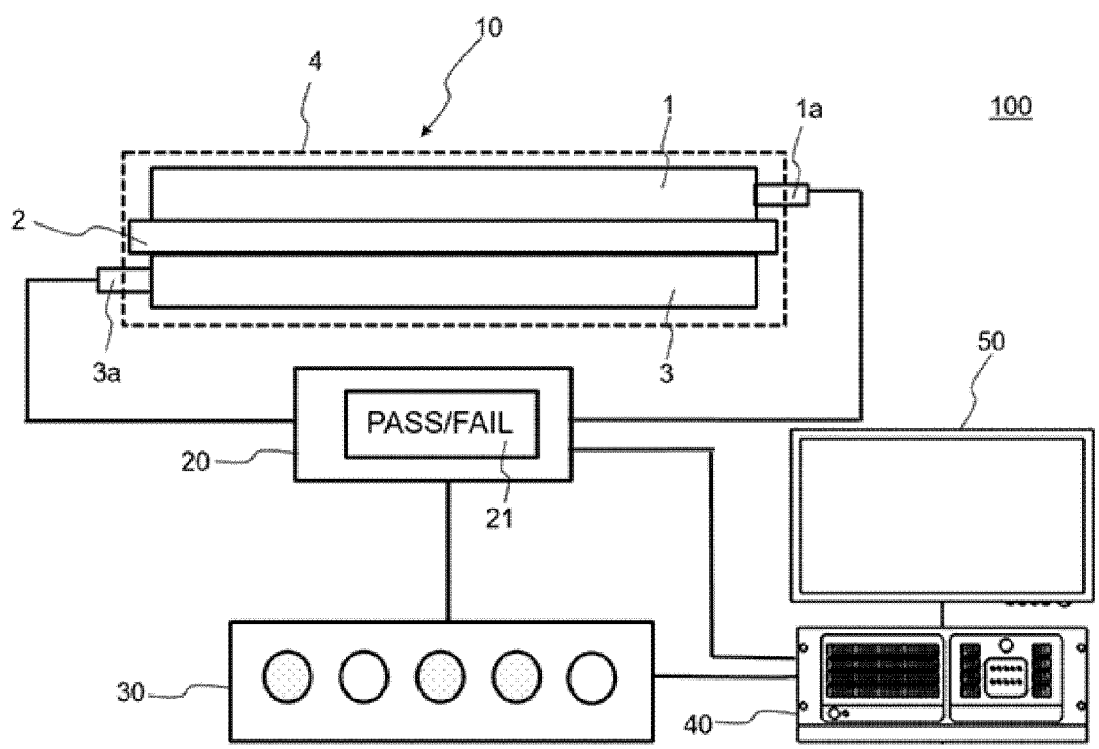

[FIG. 3]
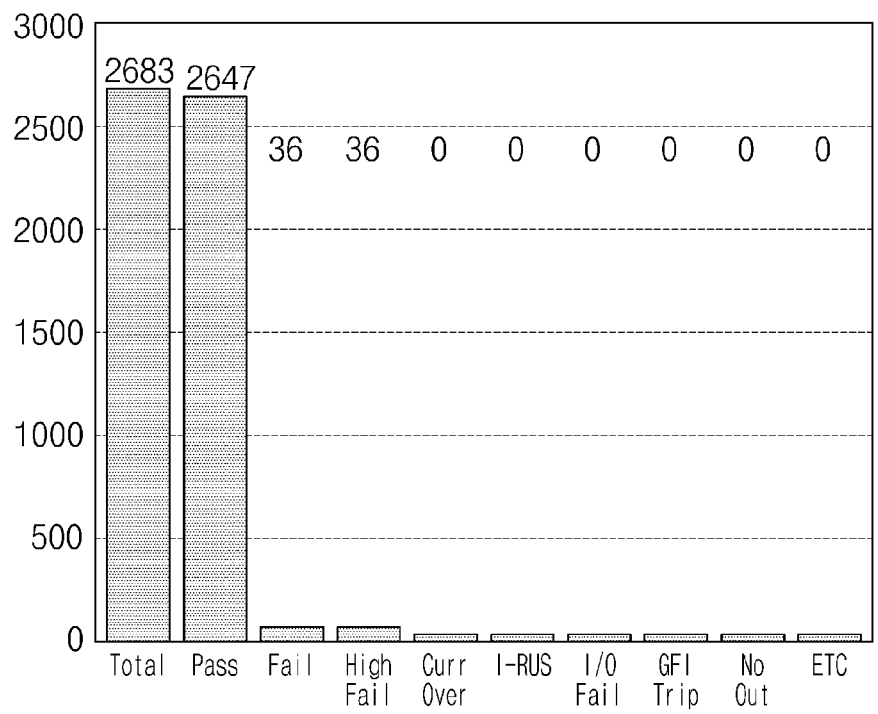

[FIG. 4]
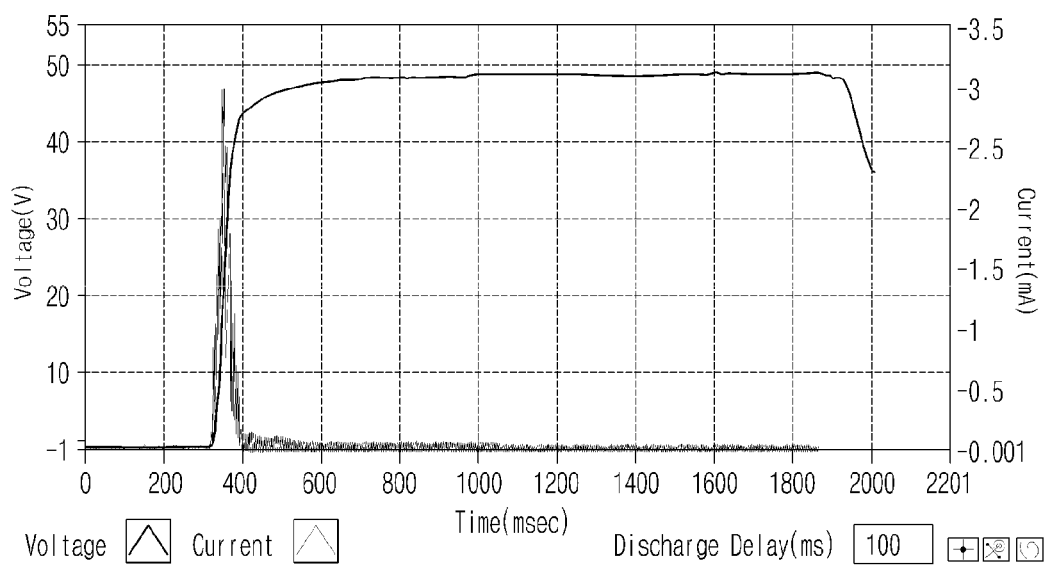

[FIG. 5]
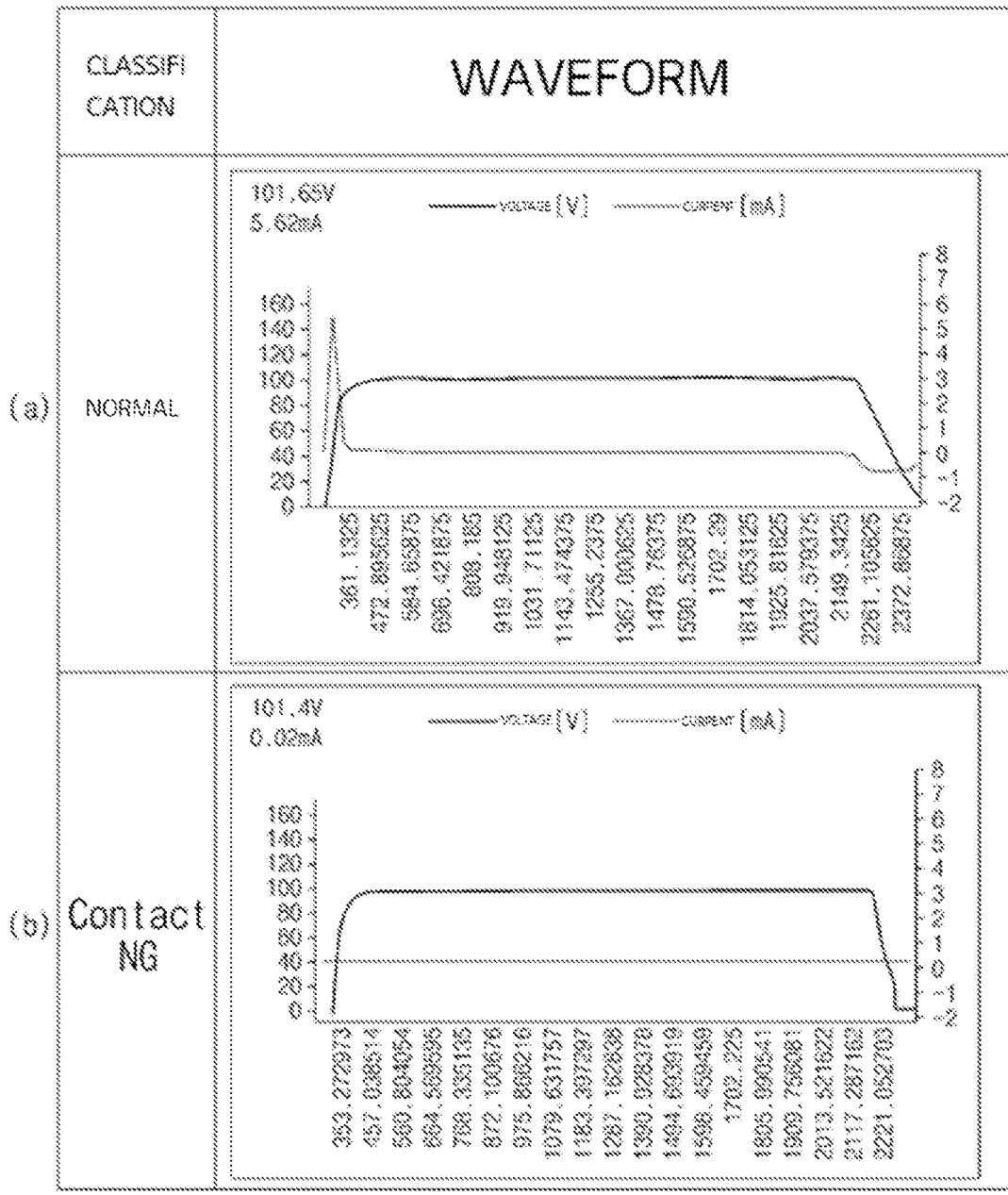

[FIG. 6]
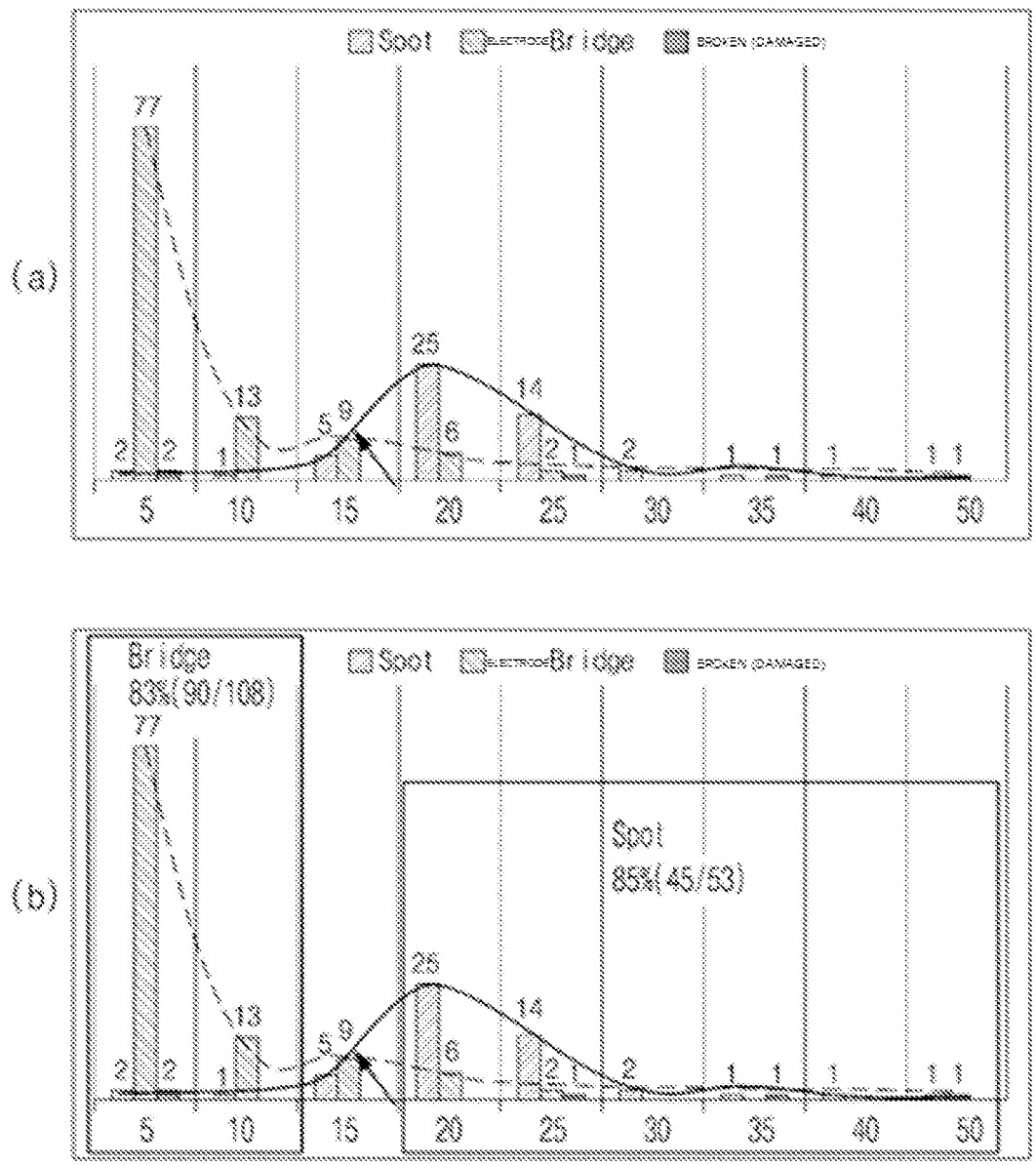

[FIG. 7]
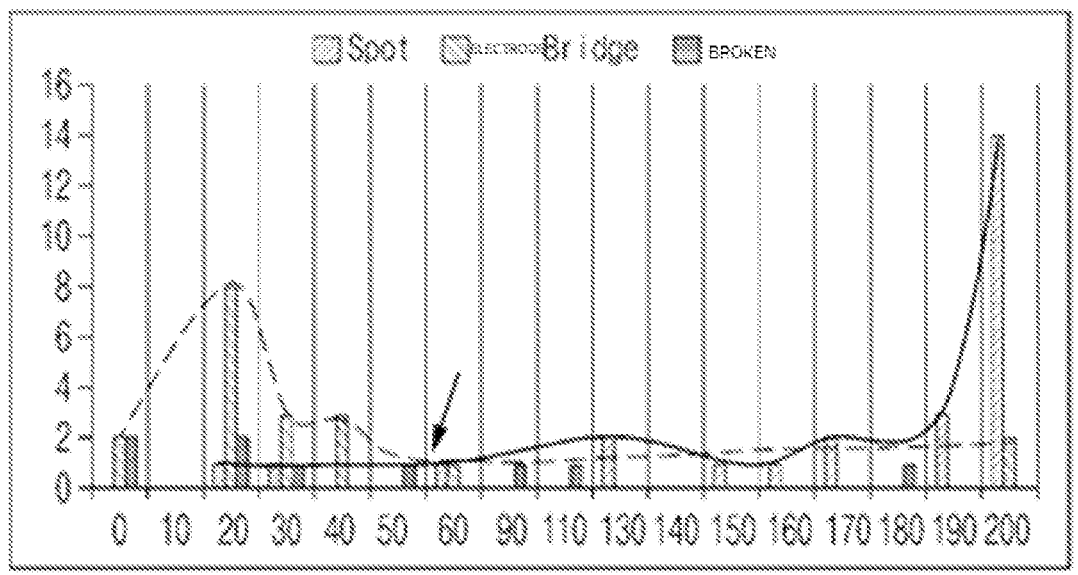

DEVICE FOR INSPECTING FOR ELECTRODE ASSEMBLY DEFECTS BEFORE ELECTROLYTE INJECTION AND DEFECT INSPECTION METHOD THEREFOR

TECHNICAL FIELD

The present invention relates to an apparatus and method for inspecting failures of an electrode assembly. More particularly, the present invention relates to an apparatus and method for inspecting failures of an electrode assembly, capable of determining types of the failures of the electrode assembly before injecting an electrolyte into the electrode assembly.

This application claims the benefit of priority based on Korean Patent Application No. 10-2021-0018508, filed on Feb. 9, 2021, and the entire contents of the Korean patent application are incorporated herein by reference.

BACKGROUND ART

With the increase in technology development and demand for mobile devices, the demand for secondary batteries is also rapidly increasing. Among the secondary batteries, lithium secondary batteries are widely used as an energy source for various electronic products as well as various mobile devices because of their high energy density and high operating voltage and excellent storage and lifespan characteristics.

An electrode assembly that has a structure consisting of a positive electrode, a separator, and a negative electrode to form a lithium secondary battery is largely classified into a jelly-roll type (winding type), a stack type (stacked type), and a stack/folding type, which is a type in which the jelly-roll type and the stack type are combined, according to a structure thereof. A method of manufacturing the electrode assembly is slightly changed according to the above-described structure.

The electrode assembly is accommodated in a case, and the secondary battery may be classified into a prismatic type, a coin type, a cylindrical type, a pouch type, and the like according to a shape of the case. Next, a process of injecting an electrolyte into the case is performed. That is, the lithium secondary battery is manufactured by injecting the electrolyte in a state in which the electrode assembly is accommodated in the battery case and then sealing the case.

Meanwhile, the electrode assembly is subjected to a failure inspection process and then is accommodated in an exterior material by being filled with an electrolyte and sealed. As a method of inspecting failures before the electrolyte is injected, a short-circuit inspection for detecting a short-circuit state of the electrode assembly is performed. Before the electrolyte is injected, a positive electrode and a negative electrode of the electrode assembly are electrically insulated by a separator between the positive electrode and the negative electrode. However, during a manufacturing process, for some reason, the insulation may be broken and a short circuit, in which the positive electrode and the negative electrode are electrically connected, may occur. Since a failed electrode assembly in which a short circuit has occurred reduces manufacturing yield, the failed electrode assembly is detected by a short-circuit tester and excluded from a manufacturing line.

FIG. 1 is a schematic diagram illustrating a configuration of a conventional short-circuit tester 20.

In FIG. 1, an electrode assembly 10 is accommodated in a case 4, and an electrolyte is not injected into the case 4. The electrode assembly 10 is composed of a positive electrode 1, a separator 2, and a negative electrode 3, and the short-circuit tester 20 is electrically connected to tabs (terminals) 1$a$ and 3$a$ of the positive electrode 1 and the negative electrode 3. The short-circuit tester is provided with a predetermined power source, and applies a predetermined voltage from the power source to the electrode assembly 10 to detect a short-circuit state of the electrode assembly.

However, the conventional short-circuit tester detects a magnitude of a voltage or current of the electrode assembly 10, which is detected by applying a constant voltage to the electrode assembly 10, only at a specific time point, and compares a value of the magnitude and a set value to determine whether the electrode assembly 10 passes or fails. For example, when a current value is lower than a set value, "PASS" is displayed on a display panel 21 of the short-circuit tester 20, and when an overcurrent higher than the set value flows, "FAIL" is displayed on the display panel 21 of the short-circuit tester 20. However, although the conventional short-circuit tester 20 may find a failure, the conventional short-circuit tester 20 may not specifically identify the cause of the failure. In order to prevent a failure from occurring repeatedly, the cause of the failure should be identified and removed. In addition, for research and development of the electrode assembly, the type of failure needs to be specified.

In particular, it is difficult to detect false failures, which are not actual product failures, caused by circuit disconnection, pin contact abnormalities, or the like with the conventional short-circuit tester. When a normal electrode assembly is determined to be a failure due to equipment abnormality, this becomes a factor that reduces manufacturing yield. Alternatively, when an abnormal electrode assembly is determined to be normal due to equipment abnormality, this leads to the same result as not actually inspecting the electrode assembly, resulting in reduced inspection accuracy.

Further, there are several types of intrinsic failures in which a current exceeds a measurement upper limit due to the occurrence of a short circuit and it is determined as a High Fail by the short-circuit tester. For example, it is difficult for the conventional short-circuit tester to distinguish a bridge failure, in which separation occurs in an electrode and a separated portion connects a positive electrode and a negative electrode like a bridge to generate a short circuit, or a spot failure, in which a spot-shaped hole is generated in a separator and thus insulation between a positive electrode and a negative electrode is broken.

In order to detect the above-described types of failures, changes in voltage or current of the electrode assembly need to be specifically analyzed, but the conventional short-circuit tester calculates the magnitude of the voltage or current of the electrode assembly only at a specific time point to determine only PASS/FAIL, and is difficult to measure changes in voltage or current over time.

Accordingly, there is a need for the development of a failure inspection technique capable of inspecting the cause of a short-circuit or failure of an electrode assembly before an electrolyte is injected into a secondary battery.

PRIOR-ART DOCUMENTS

Patent Documents

Korean Patent Publication No. 10-1775213

DISCLOSURE

Technical Problem

An object of the present invention is to provide an apparatus for inspecting failures of an electrode assembly, capable of effectively determining types of the failures of the electrode assembly before injecting an electrolyte.

Another object of the present invention is to provide a method of inspecting failures of an electrode assembly capable of detecting a false failure, a bridge failure, and a spot failure that may not be determined by a conventional short-circuit tester.

Technical Solution

One aspect of the present invention provides an apparatus for inspecting a failure of an electrode assembly before injecting an electrolyte, including a short-circuit tester configured to detect a short circuit of the electrode assembly by applying a predetermined voltage to a positive electrode and a negative electrode of the electrode assembly; a multimeter electrically connected to the short-circuit tester and configured to measure a voltage and a current of the electrode assembly over a predetermined period of time; and a failure determination part connected to the multimeter and configured to monitor a change in voltage and current measured by the multimeter and determine a type of a failure of the electrode assembly from data on the changes in voltage and current over the predetermined period of time.

In an example, the multimeter may be a digital multimeter.

In a preferred example, the failure determination part may be connected to the short-circuit tester and may receive information about short-circuit detection from the short-circuit tester.

In an example, the failure determination part may detect a false failure of the electrode assembly by comparing voltage and current waveforms.

Specifically, when there is no peak in the current waveform when the voltage waveform is a normal waveform, the failure determination part may determine the failure as the false failure.

In another example, when a peak of the current waveform, which is determined according to a size of the electrode assembly, is less than or equal to a predetermined magnitude when the voltage waveform is a normal waveform, the failure determination part may determine the failure as the false failure.

In another embodiment, the failure determination part may detect whether the electrode assembly has a bridge failure or a spot failure from data on changes in voltage and current of the electrode assembly with the failure, which is determined as a High Fail by the short-circuit tester, over the predetermined period of time.

In a specific example, the failure determination part may determine the electrode assembly having a maximum voltage lower than a threshold maximum voltage, which is a maximum voltage at a point at which maximum voltage statistical distribution curves of the electrode assembly with the bridge failure and the electrode assembly with the spot failure first overlap each other, as having the bridge failure.

Further, the failure determination part may determine the electrode assembly having a maximum voltage greater than a threshold maximum voltage, which is a maximum voltage at a point at which maximum voltage statistical distribution curves of the electrode assembly with the bridge failure and the electrode assembly with the spot failure first overlap each other, as having the spot failure.

Another aspect of the present invention provides a method of inspecting a failure of an electrode assembly before injecting an electrolyte, including measuring, by a multimeter, a voltage and a current of the electrode assembly over a predetermined period of time by applying a predetermined voltage to a positive electrode and a negative electrode of the electrode assembly using a short-circuit tester; and determining, by a failure determination part, at least one failure type from among a false failure, a bridge failure, and a spot failure from data on a change in voltage and current over the predetermined period of time.

In a specific example, in the failure inspection method, when there is no peak in a current waveform when a voltage waveform of the electrode assembly is a normal waveform, it may be determined as the false failure.

As another example, in the failure inspection method, when a peak of a current waveform, which is determined according to a size of the electrode assembly, is less than or equal to a predetermined magnitude when a voltage waveform of the electrode assembly is a normal waveform, it may be determined as the false failure.

In another embodiment, in the electrode assembly failure inspection method, when a maximum current value measured from the electrode assembly exceeds a set upper limit value, the electrode assembly having the bridge failure or the spot failure may be detected from the data on the change in voltage of the electrode assembly over the predetermined period of time.

In a specific example, an electrode assembly having a maximum voltage lower than a threshold maximum voltage, which is a maximum voltage at a point at which maximum voltage statistical distribution curves of the electrode assembly with the bridge failure and the electrode assembly with the spot failure first overlap each other, may be determined as having the bridge failure, and an electrode assembly having a maximum voltage greater than the threshold maximum voltage may be determined as having the spot failure Advantageous Effects According to the present invention, false failures of an electrode assembly before an electrolyte is injected can be accurately determined, thereby improving manufacturing yield.

Further, according to the present invention, causes of failures can be effectively specified by identifying types of intrinsic failures such as a bridge failure and a spot failure.

BRIEF DESCRIPTION OF THE DRAWINGS

FIG. 1 is a schematic diagram illustrating a configuration of a conventional short-circuit tester.

FIG. 2 is a schematic diagram illustrating a configuration of an electrode assembly failure inspection apparatus of the present invention.

FIG. 3 is a graph illustrating a result of PASS/FAIL determination by a short-circuit tester of FIG. 2.

FIG. 4 is a graph of voltage and current waveforms of a normal electrode assembly.

FIG. 5 is a set of graphs illustrating a comparison between voltage current waveforms of each of a normal electrode assembly and a false failed electrode assembly, which are measured by the electrode assembly failure inspection apparatus of the present invention.

FIG. 6 is a set of graphs illustrating maximum voltages of a bridge failure and a spot failure according to the frequency of each failure.

FIG. 7 is a graph of another embodiment illustrating maximum voltages of a bridge failure and a spot failure according to the frequency of each failure.

DETAILED DESCRIPTION OF THE PREFERRED EMBODIMENTS

Hereinafter, the detailed configuration of the present invention will be described in detail with reference to the accompanying drawings and various embodiments. The embodiments described below are exemplarily illustrated for understanding of the invention, and the accompanying drawings are not shown as actual scale to aid in understanding the invention, and dimensions of some components may be exaggerated.

While the present invention is susceptible to various modifications and alternative forms, specific embodiments thereof are shown by way of example in the drawings and will be described in detail herein. It should be understood, however, that there is no intent to limit the present invention to the particular forms disclosed, but on the contrary, the present invention is to cover all modifications, equivalents, and alternatives falling within the spirit and scope of the present invention.

An electrode assembly failure inspection apparatus of the present invention is for an electrode assembly before injecting an electrolyte. The electrode assembly before injecting an electrolyte includes all of an electrode cell assembly in which a positive electrode, a separator, and a negative electrode are laminated by a lamination process and cut in units of cells, a stacked type electrode assembly in which electrode cell assemblies are stacked, a folding type electrode assembly in which the electrode cell assembly is folded with a separator, a stack-folding type electrode assembly in which the electrode cell assembly is stacked and folded with a separator, and a packaging cell in which an electrode cell assembly is accommodated in a case but is still in a stage before an electrolyte is injected. Accordingly, the electrode assembly, which is to be inspected, of the present invention is not necessarily accommodated in a case.

FIG. 2 is a schematic diagram illustrating a configuration of an electrode assembly failure inspection apparatus of the present invention.

An electrode assembly failure inspection apparatus 100 of the present invention includes a short-circuit tester 20 configured to detect a short circuit of an electrode assembly 10 by applying a predetermined voltage to a positive electrode 1 and a negative electrode 3 of the electrode assembly 10; a multimeter 30 electrically connected to the short-circuit tester 20 and configured to measure a voltage and current of the electrode assembly 10 over time; and a failure determination part 40 connected to the multimeter 30 and configured to monitor changes in voltage and current measured by the multimeter and determine types of failures of the electrode assembly 10 from data on the changes in voltage and current over a predetermined period of time.

For convenience of description, in the inspection apparatus 100 of FIG. 2, a size of the electrode assembly 10 or a battery cell is exaggerated to be larger than those of the short-circuit tester 20, the multimeter 30, and the failure determination part 40.

The present invention includes the short-circuit tester 20 configured to apply a predetermined voltage to the electrode assembly 10, which is accommodated in the case 4 or not accommodated in the case 4, before injecting an electrolyte. The short-circuit tester 20 is provided with a predetermined power source and thus detects a short-circuit state of the electrode assembly 10 by applying a predetermined voltage from the power source to the positive electrode 1 and the negative electrode 3 of the electrode assembly 10. The short-circuit tester 20 determines whether the electrode assembly passes or fails by applying a predetermined voltage, which is set according to the type or size of the electrode assembly 10, and measuring a current/voltage that is generated due to the application of the voltage and measured from the electrode assembly.

FIG. 3 is a graph illustrating a result of PASS/FAIL determination by the short-circuit tester of FIG. 2.

As shown in FIG. 3, an example in which 36 High Fails as a failure type are detected by the short-circuit tester 20 is illustrated. The term "High Fail" refers to a failure in a case in which a short circuit is generated in the electrode assembly 10 and a current value exceeds a measurement limit of the short-circuit tester 20 or a set current upper limit. However, the short-circuit tester 20 may only determine a pass/fail of the electrode assembly, and may not identify a specific type of failure. This is because the short-circuit tester 20 is set to determine a pass/fail with a current or voltage value measured at a specific time point, and even when current/voltage values at different time points are able to be measured, corresponding numerical data measured by the short-circuit tester 20 is volatilized without being preserved due to the characteristics of the device. Accordingly, it is difficult for the short-circuit tester 20 to determine a specific type of failure, particularly, a false failure such as a pin contact failure.

The inspection apparatus 100 of the present invention includes the multimeter 30 electrically connected to the short-circuit tester 20 to measure changes in voltage and current of the electrode assembly 10 over time. Since the multimeter 30 is not provided with a power source, the multimeter 30 may not independently apply a voltage to the electrode assembly 10. However, when the multimeter 30 is electrically connected to terminals of the short-circuit tester 20, the multimeter 30 is in a form of being electrically connected to the electrode assembly 10 through the short-circuit tester 20. Thus, voltage and current values that are not preserved due to volatility in the short-circuit tester 20 may also be measured continuously through the multimeter 30. The multimeter 30 may include a digital multimeter (DMM) capable of easily measuring voltage, current, resistance, and the like.

The failure inspection apparatus 100 of the present invention also includes the failure determination part 40 connected to the multimeter 30 and configured to monitor changes in voltage and current measured by the multimeter 30 and determine types of failures of the electrode assembly 10 from data on the changes in voltage and current over a predetermined period of time. The failure determination part 40 may monitor voltage and current values over time, which are measured by the multimeter 30 over time, and visually display changes thereof in a graph or waveform. To this end, the failure determination part 40 includes a storage part configured to store voltage and current data received from the multimeter, a conversion part configured to convert a change in the data over time into visual information of a graph or waveform, and a determination part configured to determine types of failures of the electrode assembly from data on changes in voltage and current over a predetermined period of time. For the data conversion or failure determination, the failure determination part 40 is provided with a predetermined software (LAP VIEW). In addition, the inspection apparatus 100 of the present invention may include a display part 50 configured to display the visual information of changes in the voltage and current data over time in the form of a graph or waveform.

As described above, in the present invention, voltage and current values over time, which are difficult to measure using the conventional short-circuit tester, may be measured by connecting the multimeter 30 to the short-circuit tester 20, and changes in voltage and current of the electrode assembly 10 may be continuously monitored by connecting the multimeter 30 to the failure determination part 40 equipped with specially developed software. In the present invention, an inexpensive multimeter commonly used in the field of electrical engineering is provided as a part of the inspection apparatus, and the failure determination part of predetermined software determines types of failures, so that it is possible to inspect the failure of the electrode assembly 10 at low cost without employing an expensive tester such as an oscilloscope or an impulse tester.

The failure determination part 40 of the present invention may determine types of failures in consideration of not only voltage changes but also current changes over a predetermined period of time. Depending on the types of failures, the type and size of the electrode assembly 10 or a battery cell in which the electrode assembly is employed, or the like, the application time (e.g., hundreds to thousands of milliseconds) of the voltage and current changes, with which a failure may be determined, may vary.

An electrode assembly failure inspection method before injecting an electrolyte of the present invention includes measuring a voltage and current of an electrode assembly over time by applying a predetermined voltage to a positive electrode and a negative electrode of the electrode assembly; and determining at least one failure type of failures from among a false failure, a bridge failure, and a spot failure from data on changes in voltage and current over a predetermined period of time.

According to the inspection method of the present invention, first, a predetermined voltage is applied to the positive electrode and the negative electrode of the electrode assembly to measure the voltage and current of the electrode assembly over time. The application of the voltage may be performed by the short-circuit tester 20 as shown in FIG. 2. In addition, the measuring of the voltage and current of the electrode assembly over time may be performed by a digital multimeter connected to the short-circuit tester. As described above, by only connecting the digital multimeter to the conventional short-circuit tester, changes in voltage and current of the electrode assembly over time may be measured without adding a separate power source or device.

Next, the inspection method of the present invention includes determining at least one type of failure from among a false failure, a bridge failure, and a spot failure from data on changes in voltage and current over a predetermined period of time. In the present invention, the type of failures are determined by considering both data of voltage and current, not data of either voltage or current.

Hereinafter, an electrode assembly failure inspection process according to the present invention will be described in more detail.

MODES OF THE INVENTION

First Embodiment

First, a case in which an electrode assembly with a false failure is detected according to the present invention will be described.

According to the present invention, an electrode assembly with a false failure may be detected by comparing voltage and current waveforms. Voltage and current waveforms of a normal electrode assembly will be described first in order to identify waveforms in a false failure.

FIG. 4 is a graph of voltage and current waveforms of a normal electrode assembly over a predetermined period of time (2200 msec). The voltage and current waveforms are prepared on the basis of data measured by DMM-4065 from National Instruments (hereinafter, DMM-4065).

As illustrated in the drawing, when a predetermined voltage is applied, for example, by a short-circuit tester, the voltage waveform of the normal electrode assembly increases to a predetermined value determined according to the type of the electrode assembly and then decreases after a predetermined period of time. Since the electrode assembly before an electrolyte is injected is a kind of capacitor, when a voltage is applied to the electrode assembly, in each of a positive electrode and a negative electrode, charges of the corresponding polarity are collected, so that a voltage of a predetermined value (50 V in FIG. 4) is measured from the electrode assembly as shown in FIG. 4. At this point, as shown in FIG. 4, a current shows a predetermined peak value and then converges to a value close to zero. Since an electrolyte is not injected, a value of the current is close to zero because insulation resistance becomes close to infinity.

FIG. 5 is a set of graphs illustrating a comparison between voltage-current waveforms of each of a normal electrode assembly and a false failed electrode assembly, which are measured by the electrode assembly failure inspection apparatus 100 of the present invention.

In (a) of FIG. 5 is shown the voltage and current waveforms of the normal electrode assembly, which are similar to those of FIG. 4. The voltage waveform appears to be similar to that of FIG. 4 except that a maximum voltage is 101.65 V. In addition, the current waveform also appears to be close to zero, except that a peak current is 5.62 mA. On the other hand, the current waveform of the electrode assembly with a false failure in (b) of FIG. 5 is different. The false failure is a failure due to a circuit disconnection or a pin contact failure. Thus, it can be seen that, in the case of the false failure, the voltage waveform is almost the same (a maximum voltage is 101.4 V) as the waveform (normal waveform) of the normal electrode assembly but there is no peak in the current waveform.

Accordingly, according to the inspection method of the present invention, in a case in which there is no peak in the current waveform when the voltage waveform of the electrode assembly is the normal waveform, it is determined as a false failure. The voltage and current waveforms may be extracted from data on changes in voltage and current monitored by the failure determination part 40 of the inspection apparatus 100 of the present invention (see the above-described software "LAP VIEW").

Further, in the failure determination part 40 of the inspection apparatus 100 of the present invention, in a case in which there is no peak in the current waveform when the voltage waveform of the electrode assembly is the normal waveform, it is determined as a false failure.

Meanwhile, depending on the type of electrode assembly, even when there is a peak in the current waveform, the peak may be less than the peak of the normal electrode assembly. For example, even in the case of a false failure of a pin contact failure, a small peak may be measured in the current waveform depending on the contact state, rather than not completely flowing current. Thus, it can be regarded as a false failure even when the peak is less than or equal to a predetermined magnitude in addition to the case in which there is no peak in the current waveform.

Accordingly, according to an example of the inspection method of the present invention, in the case in which the peak in the current waveform is less than or equal to a predetermined magnitude when the voltage waveform of the electrode assembly is the normal waveform, it may be determined as a false failure.

Further, in the failure determination part 40 of the inspection apparatus 100 of the present invention, in the case in which the peak in the current waveform is less than or equal to a predetermined magnitude when the voltage waveform of the electrode assembly is the normal waveform, it is determined as a false failure.

Meanwhile, in the waveforms of the voltage and current monitored by the inspection apparatus 100 or the like of the present invention, even when the current waveform is the same as the waveform of the false failure, when the voltage waveform is different from the normal waveform, it is not determined as a false failure.

Second Embodiment

According to the present invention, a bridge failure and a spot failure, which may not be measured with a conventional short-circuit tester, may be detected.

The bridge failure refers to a failure in which separation occurs in an electrode and a separated portion connects a positive electrode and a negative electrode like a bridge to generate a short circuit, and the spot failure refers to a failure in which a spot-shaped hole is generated in a separator and thus insulation between a positive electrode and a negative electrode is broken When the insulation between the positive electrode and the negative electrode is broken, a current value measured in an electrode assembly exceeds a measurement limit of a short-circuit tester or exceeds or a set current upper limit. This is referred to as "High Fail." The conventional short-circuit tester may measure the High Fail, but may not determine whether the High Fail is the bridge failure or the spot failure.

In a failure inspection method of the present invention, when a maximum current value measured from the electrode assembly exceeds a set upper limit value when a predetermined voltage is applied to the electrode assembly, the electrode assemblies having a bridge failure and a spot failure may be detected from data on changes in voltage of the electrode assembly over a predetermined period of time.

The upper limit value of the maximum current value may be a set value determined as a High Fail in the short-circuit tester 20. In order to obtain information about the maximum current value of the electrode assembly, the failure determination part 40 of the inspection apparatus 100 of the present invention may be connected to the short-circuit tester 20 to receive information about the detection of a short circuit therefrom. That is, the failure inspection apparatus 100 of the present invention may receive information about a current from, for example, the short-circuit tester 20, and detect the bridge failure and the spot failure from voltage data of the multimeter 30. Alternatively, the bridge failure and the spot failure may be detected from voltage and current data measured by the multimeter 30.

In the case of the bridge failure, since a voltage is not significantly increased even when a voltage is applied by the short-circuit tester, a maximum voltage is not greater than that in the spot failure. However, when the number of electrode assemblies or battery cells to be measured is increased, the maximum voltage of the spot failure is not necessarily greater than the maximum voltage of the bridge failure. This is because, in the case of the bridge failure, a variation range of the maximum voltage is large according to the resistance of a separated electrode portion. Accordingly, it is difficult to distinguish the bridge failure and the spot failure by only the magnitude of the voltage.

In the present embodiment, in consideration of this, the bridge failure and the spot failure are distinguished by a statistical approach.

That is, first, it is determined whether the maximum current value measured from the electrode assembly exceeds a set upper limit value (e.g., a current value sufficient to be determined as a High Fail in the short-circuit tester).

When the maximum current value exceeds the upper limit value, reference is made to statistical distribution curves of the maximum voltages of the bridge failure and the spot failure of the electrode assembly.

FIG. 6 is a set of graphs illustrating maximum voltages of a bridge failure and a spot failure according to the frequency of each failure.

The graphs of FIG. 6 are prepared on the basis of data on maximum voltages measured by DMM-4065 for 164 electrode assemblies, each of which is determined as having a failure of a High Fail, in a folding process when a test voltage of a short-circuit tester 19073 (model name N2.1) is set to 50 V. In FIG. 6, an X-axis represents the maximum voltage, and a Y-axis represents the number of electrode assemblies or battery cells having the corresponding maximum voltage.

As shown in (a) of FIG. 6, although the maximum voltage of the spot failure is generally larger than the maximum voltage of the bridge failure, it can be seen that the reverse case is possible depending on the electrode assembly. However, it can be seen that, as shown in (b) of FIG. 6, most bridge failures and spot failures are respectively present on left and right sides of a point (see an arrow in FIG. 6) at which a maximum voltage statistical distribution curve, which connects the maximum voltages of the electrode assemblies with a bridge failure, and a maximum voltage statistical distribution curve, which connects the maximum voltages of the electrode assemblies with a spot failure, first meet. Accordingly, when the maximum voltage (15 V in FIG. 6) at the point at which the maximum voltage statistical distribution curves of both failures first meet is referred to as a threshold maximum voltage, the electrode assembly having a maximum voltage lower than this threshold maximum voltage may be determined as the bridge failure, and in contrast, the electrode assembly having a maximum voltage greater than the threshold maximum voltage may be determined as having the spot failure.

That is, the failure determination part 40 of the failure inspection apparatus 100 of the present invention may determine the bridge failure or the spot failure, for example, by comparing the threshold maximum voltage, which is determined from the maximum voltage statistical distribution curves of the bridge failure and the spot failure input to the storage part or another database, and the maximum voltage among the voltages of the electrode assemblies, which are measured over a predetermined period of time by a multimeter or the like, over time.

FIG. 7 is a graph of another embodiment illustrating maximum voltages of a bridge failure and a spot failure according to the frequency of each failure. The graph of FIG. 7 is prepared on the basis of data on maximum voltages measured by DMM-4065 for 54 electrode assemblies, each of which is determined as having a failure of a High Fail, in a folding process when a test voltage of a short-circuit tester 19073 (model name E52) is set to 200 V.

It can be seen even in the present embodiment that bridge failures tend to be biased to a left side (lower maximum voltage) and spot failures tend to be biased to a right side (higher maximum voltage) centered on a threshold maximum voltage (55 V), which is a maximum voltage at a point at which maximum voltage statistical distribution curves of both failures first meet.

Accordingly, according to the present invention, electrode assemblies of a bridge failure and a spot failure may be easily detected from data on changes in voltage and current of the electrode assembly over a predetermined period of time.

The above description is only an example describing the technical spirit of the present invention, and it will be understood by those of skilled in the art that various changes in form and details may be made without departing from the spirit and scope of the present invention. Accordingly, the drawings disclosed herein are considered to be descriptive and not restrictive of the technical spirit of the present invention, and the scope of the technical spirit of the present invention is not limited by these drawings. The scope of the present invention should be construed by the appended claims along with the full range of equivalents to which such claims are entitled.

The invention claimed is:

1. An apparatus for inspecting a failure of an electrode assembly before injecting an electrolyte, the apparatus comprising:
   a short-circuit tester configured to detect a short circuit of the electrode assembly by applying a predetermined voltage to a positive electrode and a negative electrode of the electrode assembly;
   a multimeter electrically connected to the short-circuit tester and configured to measure a voltage and a current of the electrode assembly over a predetermined period of time; and
   a failure determination part connected to the multimeter and configured to monitor changes in voltage and current measured by the multimeter and determine a type of a failure of the electrode assembly from data on the changes in voltage and current over the predetermined period of time, the failure determination part being configured to detect a false failure of the electrode assembly by comparing voltage and current waveforms,
   wherein, when a peak of the current waveform, which is determined according to a type of the electrode assembly, is less than or equal to a predetermined magnitude when the voltage waveform is a normal waveform, the failure determination part determines the failure as the false failure.

2. The apparatus of claim 1, wherein the multimeter is a digital multimeter.

3. The apparatus of claim 1, wherein the failure determination part is connected to the short-circuit tester and receives information about short-circuit detection from the short-circuit tester.

4. The apparatus of claim 1, wherein, when there is no peak in the current waveform when the voltage waveform is the normal waveform, the failure determination part determines the failure as the false failure.

5. The apparatus of claim 1, wherein the failure determination part is configured to detect whether the electrode assembly has a bridge failure or a spot failure from data on changes in voltage and current of the electrode assembly with the failure, which is determined as a High Fail by the short-circuit tester, over the predetermined period of time, and
   wherein a High Fail is a failure in which a short circuit is generated in the electrode assembly and a current value exceeds a measurement limit of the short-circuit tester or a set current upper limit.

6. The apparatus of claim 5, wherein the failure determination part determines the electrode assembly having a maximum voltage lower than a threshold maximum voltage as having the bridge failure, and
   wherein the threshold maximum voltage is a maximum voltage at a point at which maximum voltage statistical distribution curves of the electrode assembly with the bridge failure and the electrode assembly with the spot failure first overlap each other.

7. The apparatus of claim 5, wherein the failure determination part determines the electrode assembly having a maximum voltage greater than a threshold maximum voltages as having the spot failure, and
   wherein the threshold maximum voltage is a maximum voltage at a point at which maximum voltage statistical distribution curves of the electrode assembly with the bridge failure and the electrode assembly with the spot failure first overlap each other.

8. A method of inspecting a failure of an electrode assembly before injecting an electrolyte, the method comprising:
   measuring, by a multimeter, a voltage and a current of the electrode assembly over a predetermined period of time by applying a predetermined voltage to a positive electrode and a negative electrode of the electrode assembly using a short-circuit tester; and
   determining, by a failure determination part, at least one failure type from among a false failure, a bridge failure, and a spot failure from data on changes in voltage and current over the predetermined period of time,
   wherein, when a peak of a current waveform, which is determined according to a type of the electrode assembly, is less than or equal to a predetermined magnitude when a voltage waveform of the electrode assembly is a normal waveform, it is determined as the false failure.

9. The method of claim 8, wherein, when there is no peak in the current waveform when a voltage waveform of the electrode assembly is the normal waveform, it is determined as the false failure.

10. The method of claim 8, wherein, when a maximum current value measured from the electrode assembly exceeds a set upper limit value, the electrode assembly having the bridge failure or the spot failure is detected from the data on the change in voltage of the electrode assembly over the predetermined period of time.

11. The method of claim 10, wherein, when the electrode assembly has a maximum voltage lower than a threshold maximum voltage, the electrode assembly is determined as having the bridge failure, and
  wherein the threshold maximum voltage is a maximum voltage at a point at which maximum voltage statistical distribution curves of the electrode assembly with the bridge failure and the electrode assembly with the spot failure first overlap each other.

12. The method of claim 10, wherein, when the electrode assembly has a maximum voltage greater than a threshold maximum voltage, the electrode assembly is determined as having the spot failure, and
  wherein the threshold maximum voltage is a maximum voltage at a point at which maximum voltage statistical distribution curves of the electrode assembly with the bridge failure and the electrode assembly with the spot failure first overlap each other.

* * * * *